(12) United States Patent
Laidig et al.

(10) Patent No.: US 10,114,297 B2
(45) Date of Patent: Oct. 30, 2018

(54) ACTIVE EYE-TO-EYE WITH ALIGNMENT BY X-Y CAPACITANCE MEASUREMENT

(71) Applicant: Applied Materials, Inc., Santa Clara, CA (US)

(72) Inventors: Thomas L. Laidig, Richmond, CA (US); Jeffrey Kaskey, Livermore, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/629,183

(22) Filed: Jun. 21, 2017

(65) Prior Publication Data

US 2018/0024436 A1   Jan. 25, 2018

Related U.S. Application Data

(60) Provisional application No. 62/365,885, filed on Jul. 22, 2016.

(51) Int. Cl.
| | | |
|---|---|---|
| *G03B 27/44* | (2006.01) | |
| *G03B 27/54* | (2006.01) | |
| *G03F 7/20* | (2006.01) | |

(52) U.S. Cl.
CPC .......... *G03F 7/7085* (2013.01); *G03F 7/2051* (2013.01); *G03F 7/70258* (2013.01); *G03F 7/70275* (2013.01); *G03F 7/70833* (2013.01)

(58) Field of Classification Search
CPC .... G03F 7/2051; G03F 7/2057; G03F 7/7085; G03F 7/70808; G03F 7/70825; G03F 7/70833; G03F 7/70883; G03F 7/70891; G03F 7/70275

USPC ......... 355/46, 52, 53, 55, 67–71, 72–74, 77; 250/492.1, 492.2, 492.22, 548
See application file for complete search history.

(56) References Cited

U.S. PATENT DOCUMENTS

| | | | | |
|---|---|---|---|---|
| 5,602,620 A | * | 2/1997 | Miyazaki | G03F 7/70275 355/53 |
| 5,617,211 A | * | 4/1997 | Nara | G03F 7/70241 250/548 |
| 6,813,000 B1 | * | 11/2004 | Nishi | G03F 7/70358 355/53 |
| 9,547,242 B2 | * | 1/2017 | Ito | G01B 11/26 |
| 2002/0006561 A1 | * | 1/2002 | Taniguchi | G03F 7/70258 430/22 |

(Continued)

*Primary Examiner* — Christina A Riddle
(74) *Attorney, Agent, or Firm* — Patterson + Sheridan LLP

(57) ABSTRACT

Embodiments of the present disclosure generally relate to systems and methods for performing photolithography processes. In one embodiment, a photolithography system includes a plurality of image projection systems each having an extendable lens, and a plate having a plurality of openings. Each extendable lens is configured to be extended through a corresponding opening of the plurality of openings during operation. The plate includes one or more elements disposed adjacent each opening and each lens includes one or more elements formed thereon. The one or more elements formed on the plate and the one or more elements formed on the lens are utilized to measure one or more distances between the lens and the plate. Any deviation of the measured distance from a reference distance indicates that the lens has been shifted. Measures to compensate for the shifting of the lens will be performed.

20 Claims, 9 Drawing Sheets

(56) References Cited

U.S. PATENT DOCUMENTS

| | | | | |
|---|---|---|---|---|
| 2003/0179357 A1* | 9/2003 | Ravensbergen | ......... | G01D 5/38 355/67 |
| 2007/0296936 A1* | 12/2007 | Kato | ................ | G03F 7/70275 355/52 |
| 2009/0237793 A1* | 9/2009 | Koo | .................... | G02B 27/646 359/555 |
| 2016/0282728 A1 | 9/2016 | Johnston et al. | | |

\* cited by examiner

ACTIVE EYE-TO-EYE WITH ALIGNMENT BY X-Y CAPACITANCE MEASUREMENT

CROSS-REFERENCE TO RELATED APPLICATIONS

This application claims priority to U.S. Provisional Patent Application Ser. No. 62/365,885, filed on Jul. 22, 2016, which herein is incorporated by reference.

BACKGROUND

Field

Embodiments of the present disclosure generally relate to systems and methods for processing one or more substrates, and more specifically to systems and methods for performing photolithography processes.

Description of the Related Art

Photolithography is widely used in the manufacturing of semiconductor devices and display devices, such as liquid crystal displays (LCDs). Large area substrates are often utilized in the manufacture of LCDs. LCDs, or flat panels, are commonly used for active matrix displays, such as computers, touch panel devices, personal digital assistants (PDAs), cell phones, television monitors, and the like. Generally, flat panels may include a layer of liquid crystal material forming pixels sandwiched between two plates. When power from the power supply is applied across the liquid crystal material, an amount of light passing through the liquid crystal material may be controlled at pixel locations enabling images to be generated.

Microlithography techniques are generally employed to create electrical features incorporated as part of the liquid crystal material layer forming the pixels. According to this technique, a light-sensitive photoresist is applied to at least one surface of a substrate. Then, a pattern generator exposes selected areas of the light-sensitive photoresist as part of a pattern with light to cause chemical changes to the photoresist in the selective areas to prepare these selective areas for subsequent material removal and/or material addition processes to create the electrical features. A plurality of image projection systems, or eyes, may be utilized to project light on the light-sensitive photoresist. The image projection systems may be shifted during operation due to thermal expansion/contraction or extending lenses closer to the substrate for focusing. The shift in the image projection systems causes a shift in the pattern formed on the light-sensitive photoresist, which leads to electrical features formed on the substrate at wrong locations.

Therefore, an improved photolithography system is needed.

SUMMARY

Embodiments of the present disclosure generally relate to systems and methods for performing photolithography processes. In one embodiment, a photolithography system includes a slab, a chuck disposed on the slab, and a plurality of image projection systems disposed over the slab. Each image projection system of the plurality of image projection systems includes a lens, and the lens includes a lens housing. The photolithography system further includes one or more sensors coupled to the lens housing of the lens of each image projection system, and a plate disposed between the slab and the plurality of image projection systems. The plate includes a plurality of openings and one or more targets disposed adjacent to each opening of the plurality of openings.

In another embodiment, a photolithography system includes a slab, a chuck disposed on the slab, and a plurality of image projection systems disposed over the slab. Each image projection system of the plurality of image projection systems includes a lens, and the lens includes a lens housing. The photolithography system further includes one or more targets coupled to the lens housing of the lens of each image projection system, and a plate disposed between the slab and the plurality of image projection systems. The plate includes a plurality of openings and one or more sensors disposed adjacent to each opening of the plurality of openings.

In another embodiment, a method includes moving a substrate under a plurality of image projection systems, each image projection system of the plurality of image projection systems includes a lens, extending the lens towards the substrate disposed on a chuck, the lens is extended through an opening formed in a plate, the plate is disposed between the substrate and the plurality of image projection systems, the plate includes one or more elements disposed adjacent to the opening, and measuring one or more distances between the lens and the one or more elements.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

Embodiments of the present disclosure generally relate to systems and methods for performing photolithography processes. In one embodiment, a photolithography system includes a plurality of image projection systems each having an extendable lens, and a plate having a plurality of openings. Each extendable lens is configured to be extended through a corresponding opening of the plurality of openings during operation. The plate includes one or more elements disposed adjacent each opening and each lens includes one or more elements formed thereon. The one or more elements formed on the plate and the one or more elements formed on the lens are utilized to measure one or more distances between the lens and the plate. Any deviation of the measured distance from a reference distance indicates that the lens has been shifted. Measures to compensate for the shifting of the lens will be performed.

Figure 1:
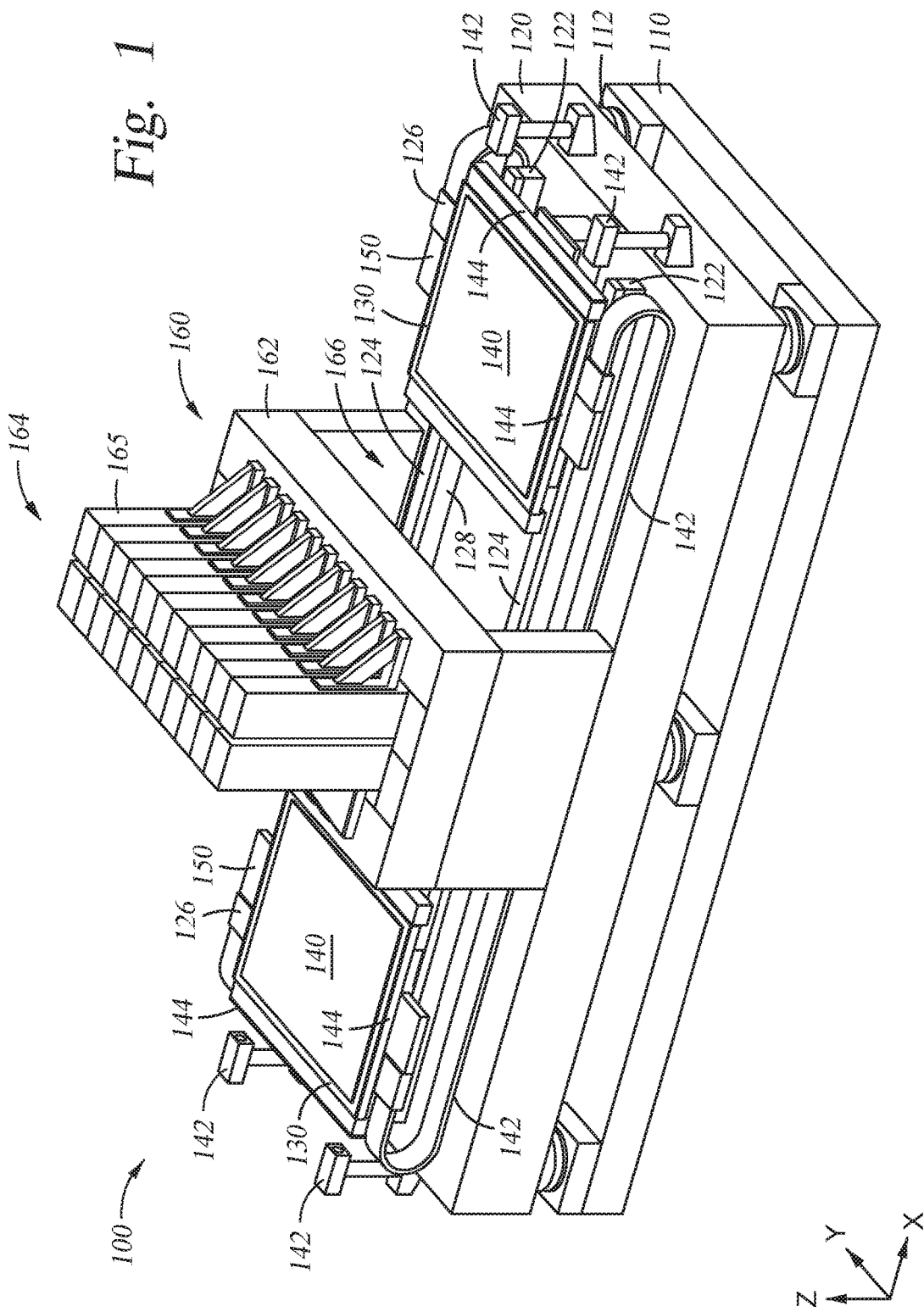
FIG. 1 is a perspective view of a system according to embodiments disclosed herein.

FIG. 1 is a perspective view of a system 100 according to embodiments disclosed herein. The system 100 includes a base frame 110, a slab 120, two or more chucks 130, and a processing apparatus 160. The base frame 110 may rest on the floor of a fabrication facility and supports the slab 120. Passive air isolators 112 are positioned between the base frame 110 and the slab 120. The slab 120 may be a monolithic piece of granite, and the two or more chucks 130 are disposed on the slab 120. In some embodiments, two chucks 130 are disposed on the slab 120 and the two chucks 130 are aligned in a first direction, such as the X-direction, as shown in FIG. 1. A substrate 140 is supported by each of the two or more chucks 130. A plurality of openings (not shown) may be formed in each chuck 130 for allowing a plurality of lift pins (not shown) to extend therethrough. The lift pins may rise to an extended position to receive the substrate 140, such as from a transfer robot (not shown). The transfer robot may position the substrate 140 on the lift pins, and the lift pins may thereafter gently lower the substrate 140 onto each chuck 130.

The substrate 140 may, for example, be made of alkaline earth boro-aluminosilicate glass and be used as part of a flat panel display. In other embodiments, the substrate 140 may be made of other materials, such as a polymeric material. In some embodiments, the substrate 140 may have a photoresist layer formed thereon. A photoresist is sensitive to radiation and may be a positive photoresist or a negative photoresist, meaning that portions of the photoresist exposed to radiation will be respectively soluble or insoluble to photoresist developer applied to the photoresist after the pattern is written into the photoresist. The chemical composition of the photoresist determines whether the photoresist will be a positive photoresist or negative photoresist. For example, the photoresist may include at least one of diazonaphthoquinone, a phenol formaldehyde resin, poly(methyl methacrylate), poly(methyl glutarimide), and SU-8. In this manner, the pattern may be created on a surface of the substrate 140 to form the electronic circuitry.

The system 100 further includes a pair of supports 122 and a pair of tracks 124. The pair of tracks 124 is supported by the pair of the supports 122, and the two or more chucks 130 may move along the tracks 124 in the X-direction. The tracks 124 and the supports 122 may be lifted by an air bearing system (not shown) during operation. In one embodiment, the pair of tracks 124 is a pair of parallel magnetic channels. As shown, each track 124 of the pair of tracks 124 is linear. In other embodiments, the track 124 may have a non-linear shape. Cable carriers 126 are coupled to each chuck 130. The system may include an encoder (not shown) for measuring the location information of the substrate 140. The chuck 130 is a distance away from the encoder in the Z-direction, and the distance may be 200 to 250 mm. Due to the stiffness of the structure, the actual location of the chuck 130 in the X-direction or Y-direction and the location of the chuck 130 measured by the encoder in the X-direction or the Y-direction may be off. In order to more accurately measure the location of the substrate 140 during operation, a plurality of interferometers 142 are disposed on the slab 120, and the interferometers 142 are aligned with mirrors 144 coupled to each chuck 130. The mirrors 144 are located closer to the substrate 140 in the Z-direction than the encoder, thus the location information measured by the interferometers 142 is more accurate than the location information measured by the encoder. The chuck 130 may be a vacuum chuck that can secure the substrate 140 to the chuck 130, so the difference in location between the chuck 130 and the substrate 140 is minimized. The interferometers 142 may be any suitable interferometers, such as high stability plane mirror interferometers. The location information of the substrate 140 measured by the interferometers 142 may be provided to the controller (not shown), and the controller controls the motion of the chucks 130.

The processing apparatus 160 includes a support 162 and a processing unit 164. The support 162 is disposed on the slab 120 and includes an opening 166 for the two or more chucks 130 to pass under the processing unit 164. One or more interferometers 142 may be disposed on the slab 120 under the support 162. The processing unit 164 is supported by the support 162. In one embodiment, the processing unit 164 is a pattern generator configured to expose a photoresist in a photolithography process. In some embodiments, the pattern generator may be configured to perform a maskless lithography process. The processing unit 164 may include a plurality of image projection systems (FIG. 3) disposed in a case 165. The processing apparatus 160 may be utilized to perform maskless direct patterning. During operation, one of the two or more chucks 130 moves in the X-direction from a loading position, as shown in FIG. 1, to a processing position. The processing position may refer to one or more positions of the chuck 130 as the chuck 130 passes under the processing unit 164. During operation, the two or more chucks 130 may be lifted by a plurality of air bearings (not shown) and may move along the pair of tracks 124 from the loading position to the processing position. A plurality of vertical guide air bearings (not shown) may be coupled to each chuck 130 and positioned adjacent an inner wall 128 of each support 122 in order to stabilize the movement of the chuck 130. Each of the two or more chucks 130 may also move in the Y-direction by moving along a track 150 for processing and/or indexing the substrate 140.

The system 100 also includes a controller (not shown). The controller is generally designed to facilitate the control and automation of the processing techniques described herein. The controller may be coupled to or in communication with one or more of the processing apparatus 160, the chucks 130, and the interferometers 142. The processing apparatus 160 and the chucks 130 may provide information to the controller regarding the substrate processing and the substrate aligning. For example, the processing apparatus 160 may provide information to the controller to alert the controller that substrate processing has been completed. The interferometers 142 may provide location information to the controller, and the location information is then used to control the chucks 130 and the processing apparatus 160.

The controller may include a central processing unit (CPU) (not shown), memory (not shown), and support circuits (or I/O) (not shown). The CPU may be one of any form of computer processors that are used in industrial settings for controlling various processes and hardware (e.g., pattern generators, motors, and other hardware) and monitor the processes (e.g., processing time and substrate position). The memory (not shown) is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits (not shown) are also connected to the CPU for supporting the processor in a conventional manner. The support circuits may include conventional cache, power supplies, clock circuits, input/output circuitry, subsystems, and the like. A program (or computer instructions) readable by the controller determines which tasks are performable on a substrate. The program may be software readable by the controller and may include code to monitor and control, for example, the processing time and substrate position.

Figure 2:
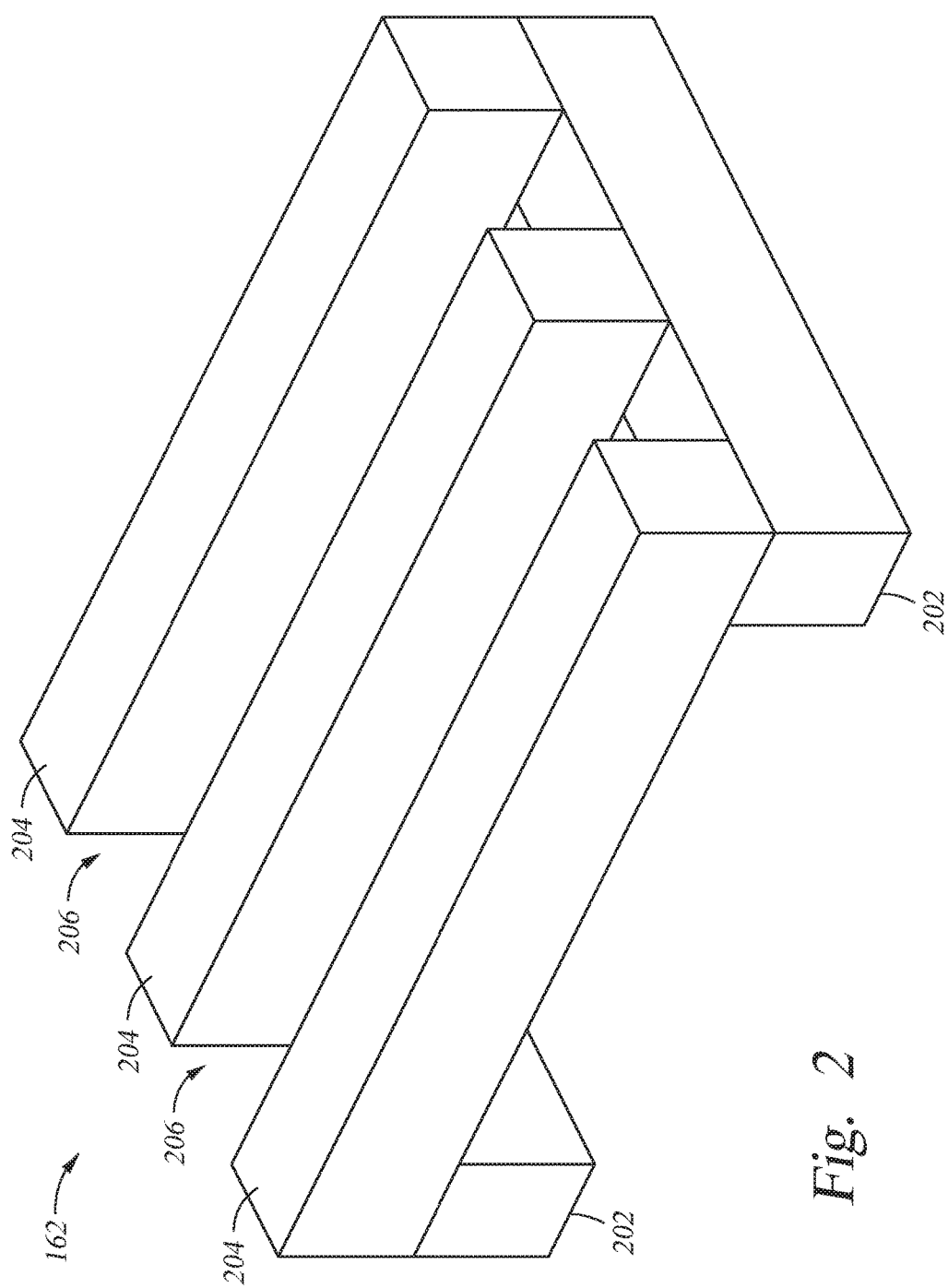
FIG. 2 is schematic perspective views of a support of the system shown in FIG. 1 according to embodiments disclosed herein.

FIG. 2 is a schematic perspective view of the support 162 of the system 100 shown in FIG. 1 according to embodiments disclosed herein. As shown in FIG. 2, the support 162 includes a base 202 disposed on the slab 120 and one or more beams 204 for supporting the processing unit 164 (FIG. 1). One or more gaps 206 are formed between adjacent beams 204. The maskless direct patterning may be performed on the substrate 140 (FIG. 1) by the processing unit 164 through gaps 206 between adjacent beams 204. The beams 204 may be substantially parallel. In one embodiment, there are three beams 204, as shown in FIG. 2. The support 162 may have a height of about 3 to 4 feet, so the processing unit 164 (FIG. 1) may be located 2 to 3 feet over (in the Z-direction shown in FIG. 1) the chuck 130 when the chuck 130 is in the processing position.

Figure 3:
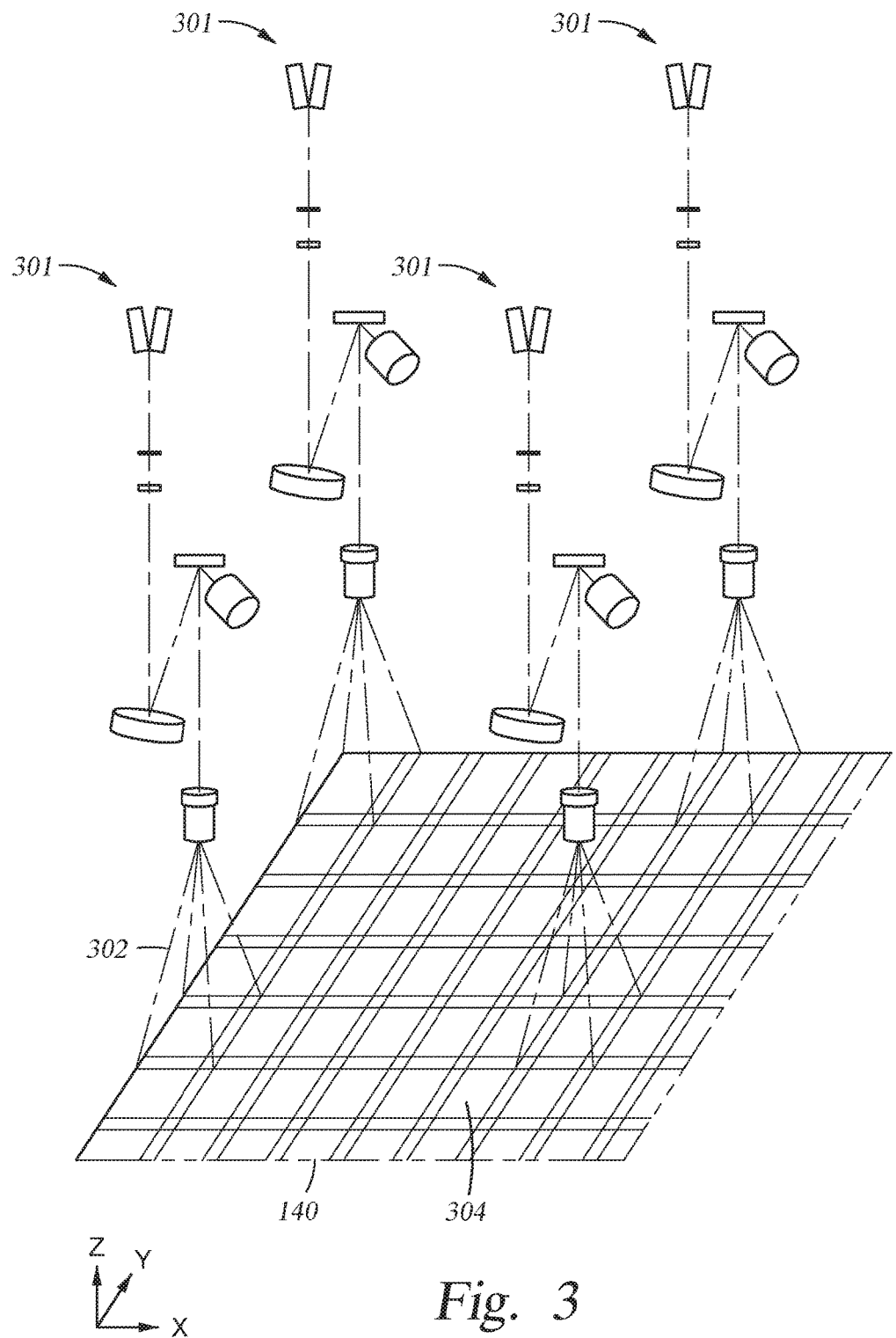
FIG. 3 is a perspective schematic view of a plurality of image projection systems according to embodiments disclosed herein.

FIG. 3 is a perspective schematic view of a plurality of image projection systems 301 according to one embodiment. As shown in FIG. 3, each image projection system 301 produces a plurality of light beams 302 onto a surface 304 of the substrate 140. As the substrate 140 moves in the X-direction and Y-direction, the surface 304 is patterned by the light beams 302. The number of the image projection systems 301 may vary based on the size of the substrate 140 and/or the speed of chuck 130. In one embodiment, there are 22 image projection systems 301 in the processing apparatus 160.

Figure 4:
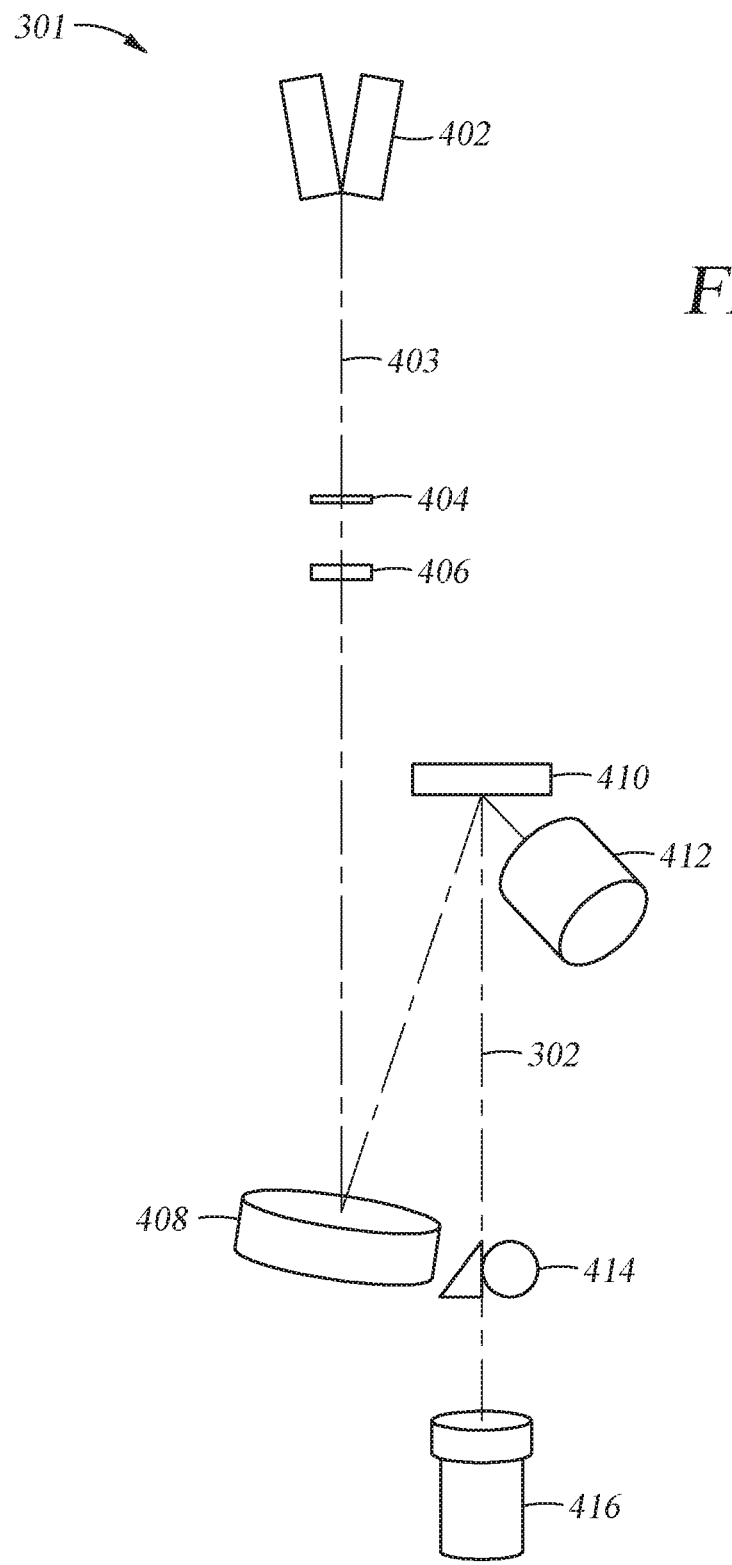
FIG. 4 is a perspective schematic view of an image projection system of the plurality of image projection systems of FIG. 3 according to embodiments disclosed herein.

FIG. 4 is a perspective schematic view of one image projection system 301 of the plurality of image projection systems 301 of FIG. 3 according to one embodiment. The image projection system 301 includes a light source 402, an aperture 404, a lens 406, a mirror 408, a digital micro-mirror device (DMD) 410, a light dump 412, a camera 414, and a projection lens 416. The light source 402 may be a light emitting diode (LED) or a laser, and the light source 402 may be capable of producing a light having predetermined wavelength. In one embodiment, the predetermined wavelength is in the blue or near ultraviolet (UV) range, such as less than about 450 nm. The mirror 408 may be a spherical mirror. The projection lens 416 may be a 10× objective lens. The projection lens 416 may be extendable. During operation, the projection lens 416 may be extended to a location about less than 5.5 mm above the substrate 140, while the image projection system 301 is located about 2 to 3 feet over the chuck 130. The DMD 410 may include a plurality of mirrors, and the number of mirrors may correspond to the resolution of the projected image. In one embodiment, the DMD 410 includes 1920×1080 mirrors, which represent the number of pixels of a high definition television.

During operation, a light beam 403 having a predetermined wavelength, such as a wavelength in the blue range, is produced by the light source 402. The light beam 403 is reflected to the DMD 410 by the mirror 408. The DMD 410 includes a plurality of mirrors that may be controlled individually, and each mirror of the plurality of mirrors of the DMD 410 may be at "on" position or "off" position, based on the mask data provided to the DMD 410 by the controller (not shown). When the light beam 403 reaches the mirrors of the DMD 410, the mirrors that are at "on" position reflect the light beam 403, i.e., forming the plurality of light beams 302, to the projection lens 416. The projection lens 416 then projects the light beams 302 to the surface 304 of the substrate 140. The mirrors that are at "off" position reflect the light beam 403 to the light dump 412 instead of the surface 304 of the substrate 140.

Figure 5:
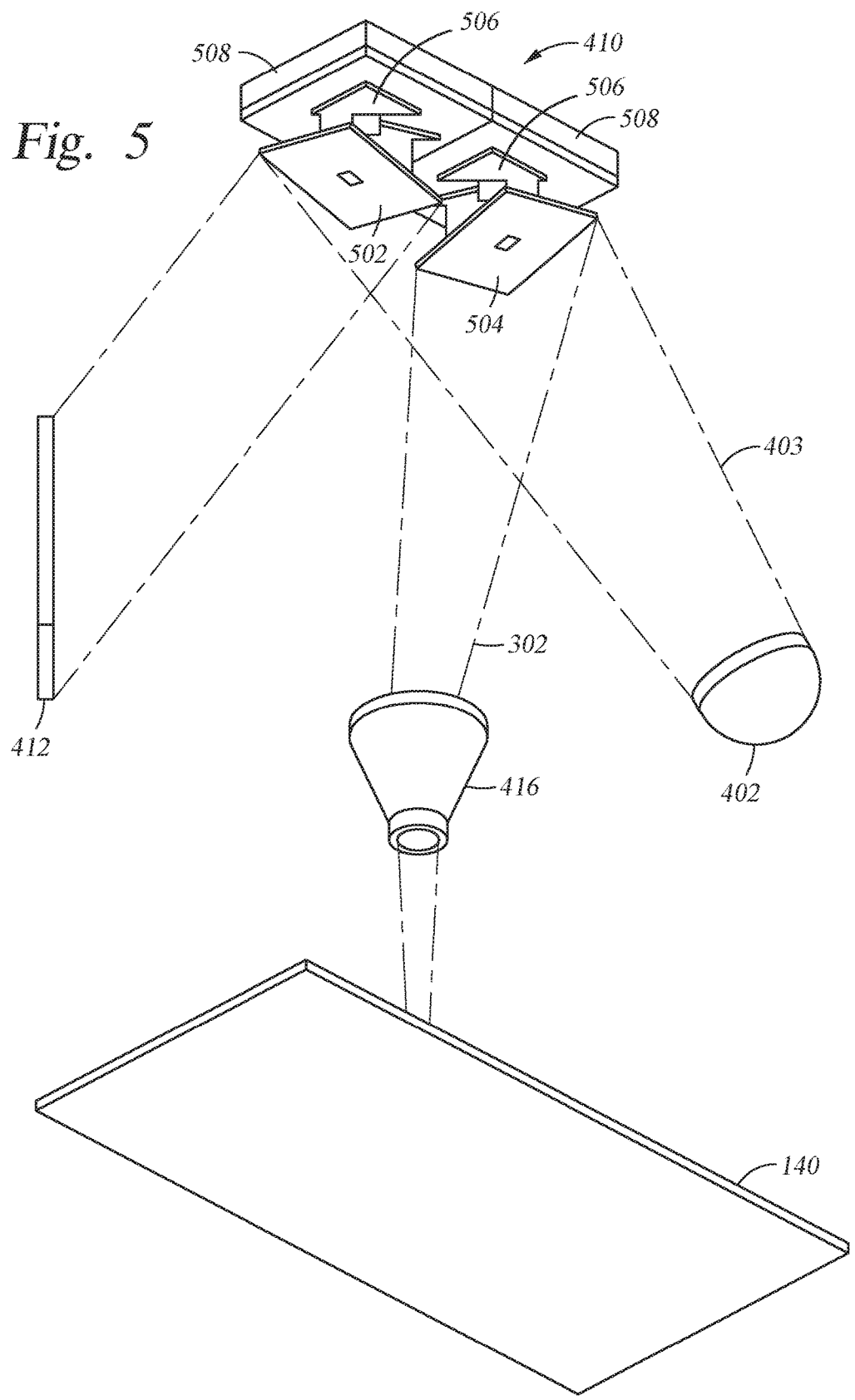
FIG. 5 schematically illustrates a beam being reflected by two mirrors of a digital micro-mirror device (DMD) according to embodiments disclosed herein.

FIG. 5 schematically illustrates the beam 403 being reflected by two mirrors 502, 504 of a DMD 410 according to one embodiment. As shown, each mirror 502, 504 is disposed on a titling mechanism 506, which is disposed on a memory cell 508. The memory cell 508 may be a CMOS SRAM. During operation, each mirror 502, 504 is controlled by loading the mask pattern data into the memory cell 508. The mask pattern data electrostatically controls the tilting of the mirror 502, 504 in a binary fashion. When the mirror 502 or 504 is in a reset mode or without power applied to the DMD 410, the mirror 502 or 504 is set to be flat and not corresponding to any binary position. When power is applied to the DMD 410, 0 in binary may correspond to "off" position, which means the mirror 502 or 504 is tilted at −10, −12 or any feasible negative tilting degrees, and 1 in binary may correspond to "on" position, which means the mirror is tilted at 10, 12 or any feasible positive tilting degrees. For example, as shown in FIG. 5, the mirror 502, which is at "off" position, reflects the light beam 403 generated from the light source 402 to the light dump 412. The mirror 504, which is at "on" position, forms the light beam 302 by reflecting the light beam 403 to the projection lens 416.

During operation, the lens 416 of one or more image projection systems 301 may be extended down towards the substrate 140 in order to focus the light beam 302 onto the substrate 140. The extension of the lens 416 may not be perfectly straight, and the lens 416 may be shifted in the X-direction and/or Y-direction (FIG. 1). In addition, components of the image projection systems 301 may be shifted in the X-direction and/or Y-direction due to thermal expansion or contraction during operation. Shifting of the lens 416 or components of the image projection systems 301 can lead to incorrect pattern formed on the substrate 140. In order to identify and compensate for the shift of the lens 416, a plate is utilized.

Figure 6:
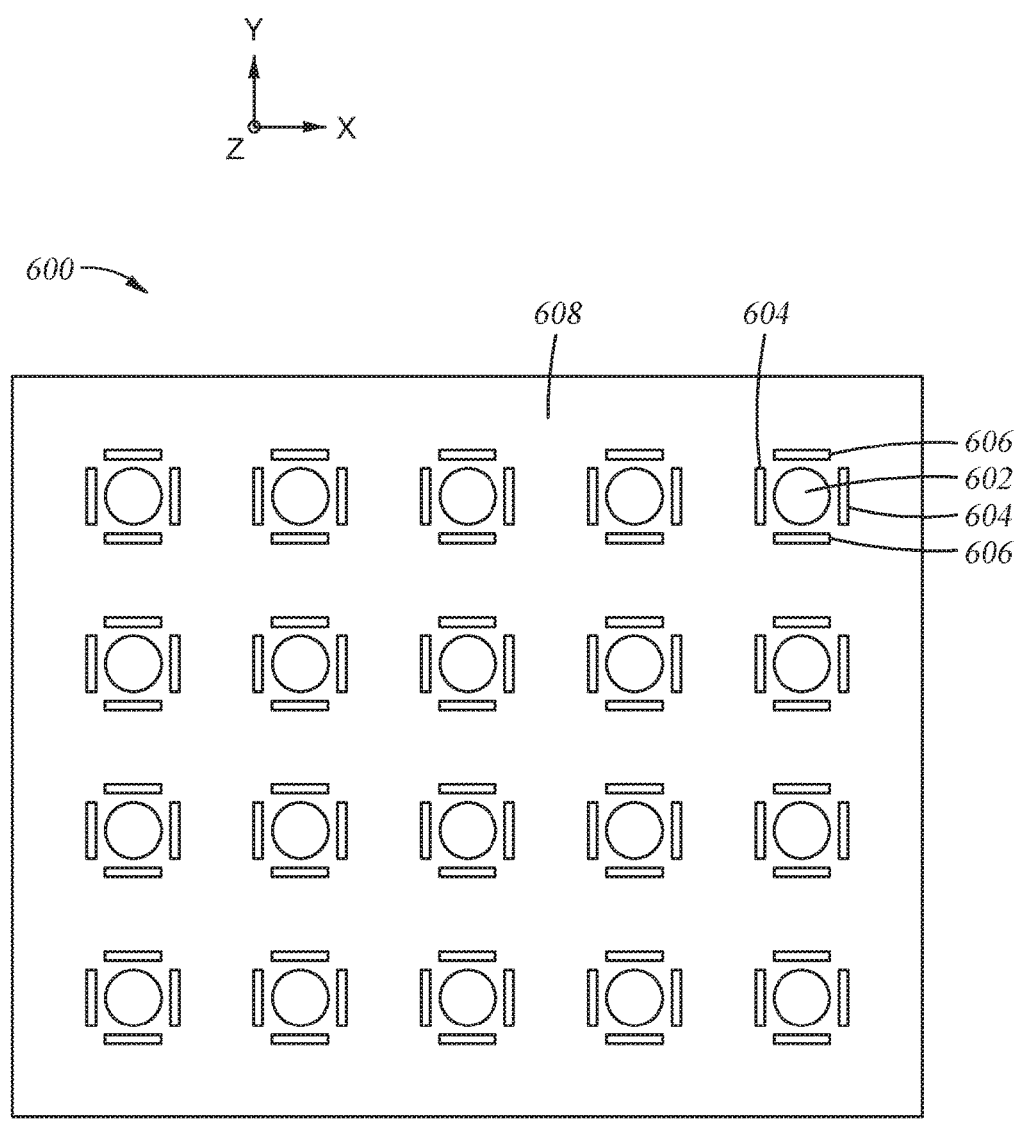
FIG. 6 is a schematic top view of a plate according to embodiments disclosed herein.

FIG. 6 is a schematic bottom view of a plate 600 according to embodiments disclosed herein. The plate 600 may be fabricated from a material having a low coefficient of thermal expansion, such as Invar, glass, or other suitable material. The plate 600 may be rectangular or any suitable shape. The plate 600 includes a plurality of openings 602 and one or more elements 604, 606 disposed adjacent each opening 602. The elements 604, 606 may be coupled to a back surface 608 of the plate 600, and the back surface 608 may be facing the slab 120, or facing the chuck 130 and the substrate 140 during operation. The openings 602 are arranged in the plate 600 according to the arrangement of image projection systems 301 in the processing unit 164. The number of openings 602 is based on the number of image projection systems 301. Each opening 602 is aligned with a lens 416 of a corresponding image projection system 301 in the Z-direction.

The one or more elements 604, 606 may be one or more sensors or one or more targets. In one embodiment, the one or more elements 604, 606 are one or more sensors that are capable of measuring a distance between each sensor and a target. The one or more sensors may be capacitance sensors and may have a precision of 10 nm or higher. In one embodiment, the one or more elements 604, 606 are one or more targets. The one or more targets may be fabricated from a metal. The one or more targets may be one or more metal bars. In one embodiment, one element 604 and one element 606 are located adjacent to a corresponding opening 602, the element 604 and the corresponding opening 602 are aligned in the X-direction, and the element 606 and the corresponding opening 602 are aligned in the Y-direction. In one embodiment, two elements 604 and two elements 606 are located adjacent to a corresponding opening 602, the elements 604 and the corresponding opening 602 are aligned in the X-direction, and the elements 606 and the corresponding opening 602 are aligned in the Y-direction, as shown in FIG. 6.

Figure 7A:
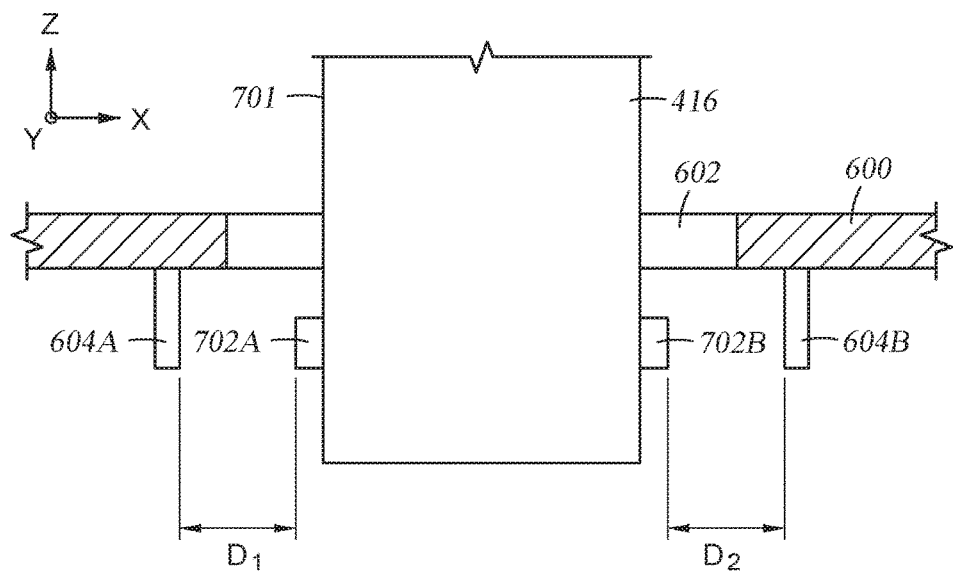
FIGS. 7A and 7B are schematic cross-sectional views of a portion of the plate of FIG. 6 and a lens of the image projection system of FIG. 4 extending through an opening formed in the plate according to embodiments disclosed herein.
Figure 7B:
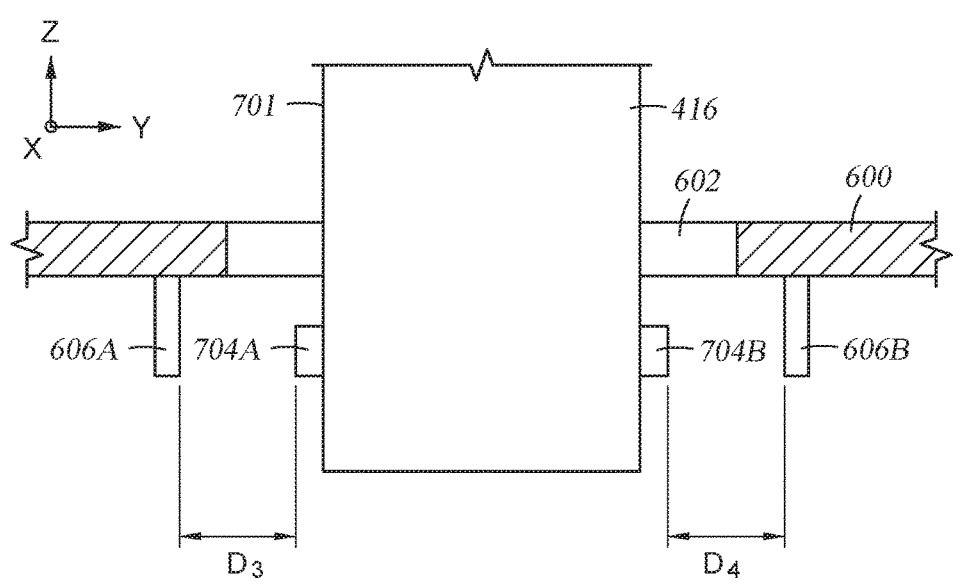

FIGS. 7A and 7B are schematic cross-sectional views of a portion of the plate 600 of FIG. 6 and the lens 416 of the image projection system 301 of FIG. 4 extending through an opening 602 formed in the plate 600 according to embodiments disclosed herein. The plate 600 may be located about 10 mm over the substrate 140 during operation, and the lens 416 may extend through the opening 602 formed in the plate 600 to a location about less than 5.5 mm over the substrate 140. The lens 416 includes a lens housing 701, and one or more elements 702A, 702B, 704A, 704B are coupled to the lens housing 701, as shown in FIGS. 7A and 7B. The one or more elements 702A, 702B, 704A, 704B may be one or more sensors or one or more targets. In one embodiment, the one or more elements 702A, 702B, 704A, 704B are one or more sensors that are capable of measuring a distance between each sensor and a target, and the targets are the one or more elements 604A, 604B, 606A, 606B formed on the plate adjacent to the opening 602. The one or more elements 604A, 604B, 606A, 606B may be the same as the one or more elements 604, 606 shown in FIG. 6. The one or more sensors may be capacitance sensors and may have a precision of 10 nm or higher.

In one embodiment, the one or more elements 702A, 702B, 704A, 704B are one or more targets, and the one or more elements 604A, 604B, 606A, 606B are sensors. The one or more targets may be fabricated from a metal. In one embodiment, one element 702A and one element 704A are coupled to the lens housing 701 of the lens 416, the element 702A and the element 604A coupled to the plate 600 are aligned in the X-direction (FIG. 7A), and the element 704A and the element 604A coupled to the plate 600 are aligned in the Y-direction (FIG. 7B). The elements 702A and 604A may be a pair of sensor/target that can be utilized to measure a distance D1 between the element 604A and the element 702A (or the lens 416). The elements 704A and 606A may be a pair of sensor/target that can be utilized to measure a distance D3 between the element 606A and the element 704A (or the lens 416). In one embodiment, four elements 702A, 702B, 704A, 704B are coupled to the lens housing 701 of the lens 416, the elements 702A, 702B and elements 604A, 604B coupled to the plate 600 are aligned in the X-direction (FIG. 7A), and the elements 704A, 704B and elements 606A, 606B coupled to the plate are aligned in the Y-direction (FIG. 7A).

If the elements 702A, 702B, 704A, 704B coupled to the lens housing 701 of the lens 416 are sensors, the corresponding elements 604A, 604B, 606A, 606B coupled to the plate 600 are targets. Alternatively, if the elements 702A, 702B, 704A, 704B coupled to the lens housing 701 of the lens 416 are targets, the corresponding elements 604A, 604B, 606A, 606B coupled to the plate 600 are sensors. The purpose of having the one or more elements 702A, 702B, 704A, 704B, 604A, 604B, 606A, 606B is to measure one or more distances D1, D2, D3, D4 during operation. If the lens 416 is centrally located within the opening 602, the distances D1, D2, D3, D4 should be equal to a reference distance and, in one embodiment are identical. During operation, any shifting of the lens 416 in the X-direction and/or Y-direction can lead to a change in one or more of the distances D1, D2, D3, D4, and the change in the distances D1, D2, D3, and/or D4 can be detected by the one or more elements 702A, 702B, 704A, 704B, 604A, 604B, 606A, 606B. Measures, such as switch one or more mirrors of the DMD 410 from "on" to "off" position or vice versa, or move the image projection system, are performed to compensate for the shifting of the lens 416. As a result, an accurate pattern is formed on the photoresist.

Figure 8:
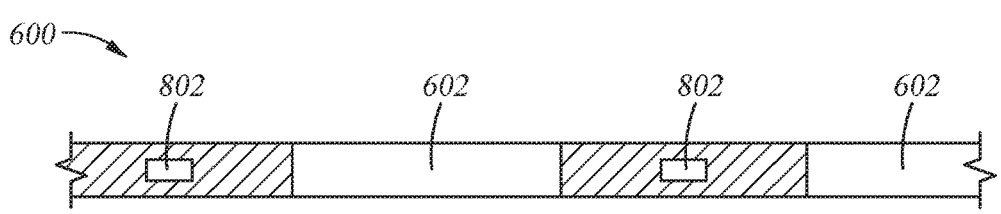
FIG. 8 is a schematic cross-sectional view of a portion of the plate of FIG. 6 according to embodiments disclosed herein.

FIG. 8 is a schematic cross-sectional view of a portion of the plate 600 of FIG. 6 according to embodiments disclosed herein. As shown in FIG. 8, one or more cooling channels 802 are formed within the plate 600 to cool the plate 600. During operation, a coolant, such as water, may be flowed through the one or more cooling channels 802 to cool the plate 600, preventing the plate 600 from thermally expanding. Other suitable cooling method may be performed on the plate 600 during operation. In another embodiment, the plate 600 is cooled via a feedback method.

Figure 9:
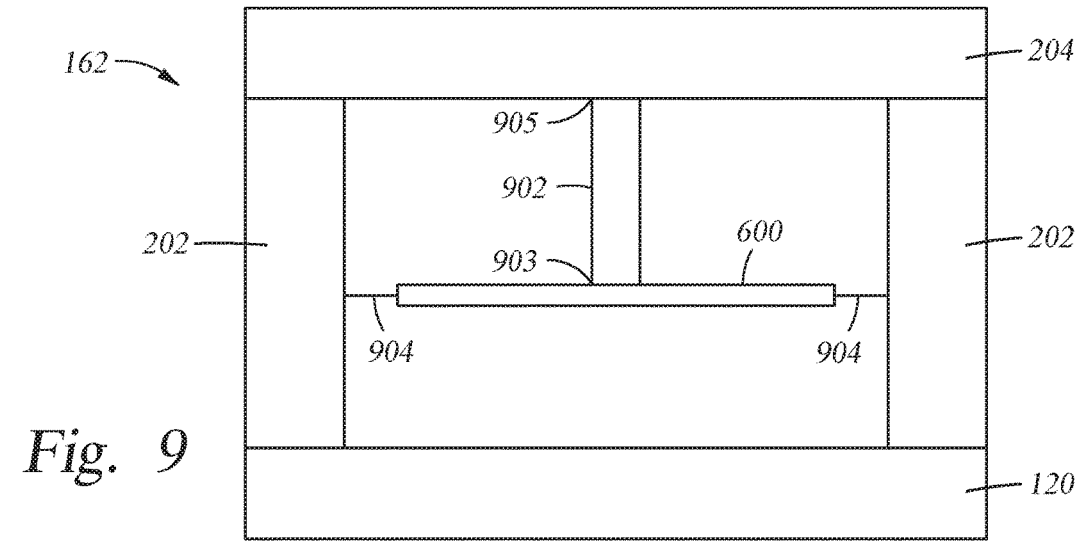
FIG. 9 is a schematic side view of the plate coupled to the support of FIG. 2 according to embodiments disclosed herein.

FIG. 9 is a schematic side view of the plate 600 coupled to the support 162 of FIG. 2 according to embodiments disclosed herein. The plate 600 may be disposed between the processing unit 164 (FIG. 1) disposed on the support 162 and the slab 120, as shown in FIG. 9. During operation, when a chuck 130 (FIG. 1) carrying a substrate 140 is in processing position, the plate 600 is disposed between the processing unit 164 (FIG. 1) and the chuck 130, or the substrate 140. The plate 600 is attached to the beam 204 of the support 162 by an attachment member 902. In one embodiment, the support 162 includes three beams 204, and the plate 600 is coupled to the center beam 204 by the attachment member 902. The attachment member 902 includes a first end 903 coupled to the plate 600 and a second end 905 coupled to the beam 204. The first end 903 of the attachment member 902 is coupled to a center of the plate 600. The attachment member 902 may be any suitable member, such as a metal bracket.

One or more flexible members 904 are utilized to couple one or more edges of the plate 600 to the base 202 of the support 162. The single rigid connection by the attachment member 902 and one or more flexible connection by the one or more flexible members 904 connecting the plate 600 to the support 160 ensure that the plate 600 is not shifted when other components of the system 100 are thermally expanded or contracted during operation.

Figure 10:
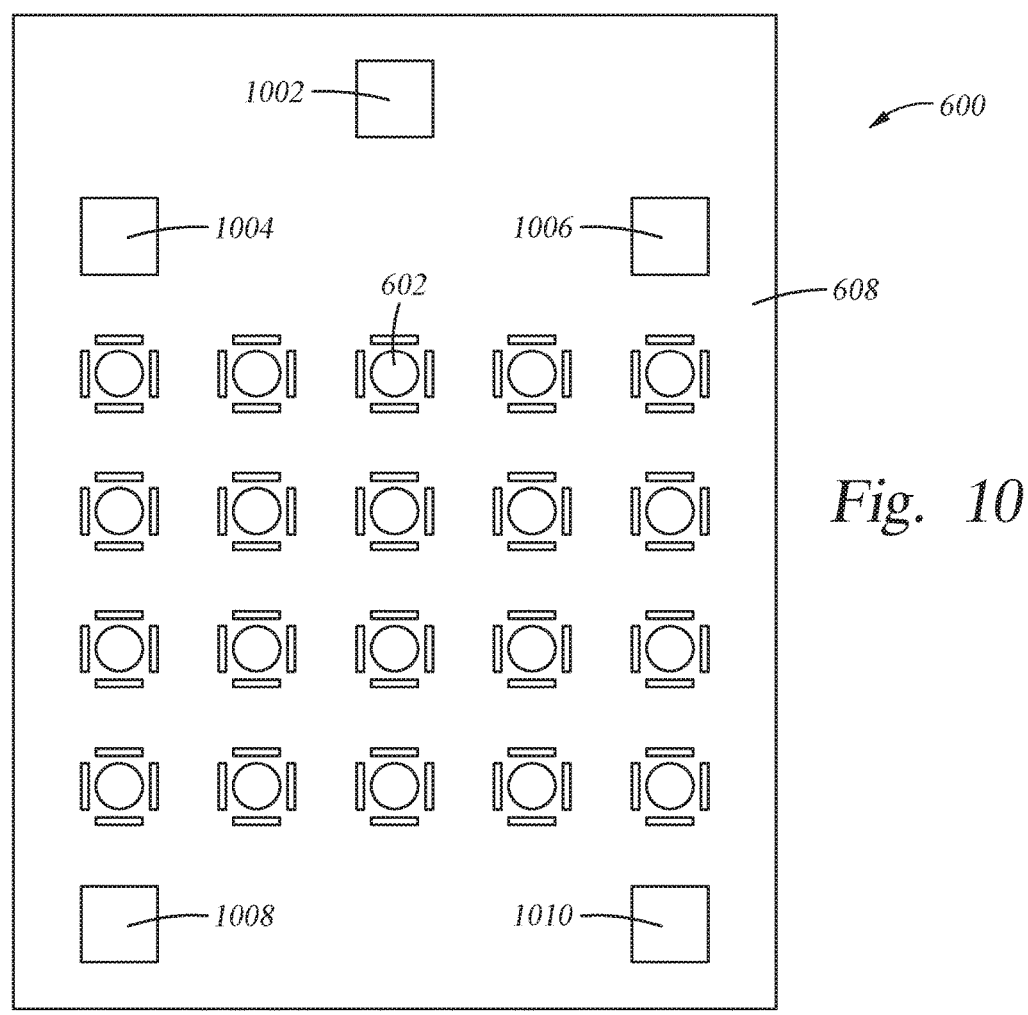
FIG. 10 is a schematic bottom view of the plate including one or more interferometers according to embodiments disclosed herein.

Since the plate 600 is used as a reference point for identifying and compensating the shifting of one or more lenses 416, the plate 600 can also be used for controlling the position of the chuck 130. FIG. 10 is a schematic bottom view of the plate 600 including one or more interferometers 1002, 1004, 1006, 1008, 1010 according to embodiments disclosed herein. Instead of having the interferometers 142 disposed on the slab 120 (FIG. 1), interferometers 1002, 1004, 1006, 1008, 1010 are coupled to the back surface 608. Interferometers 1002, 1004, 1006, 1008, 1010 may be the same as the interferometers 142.

Figure 11:
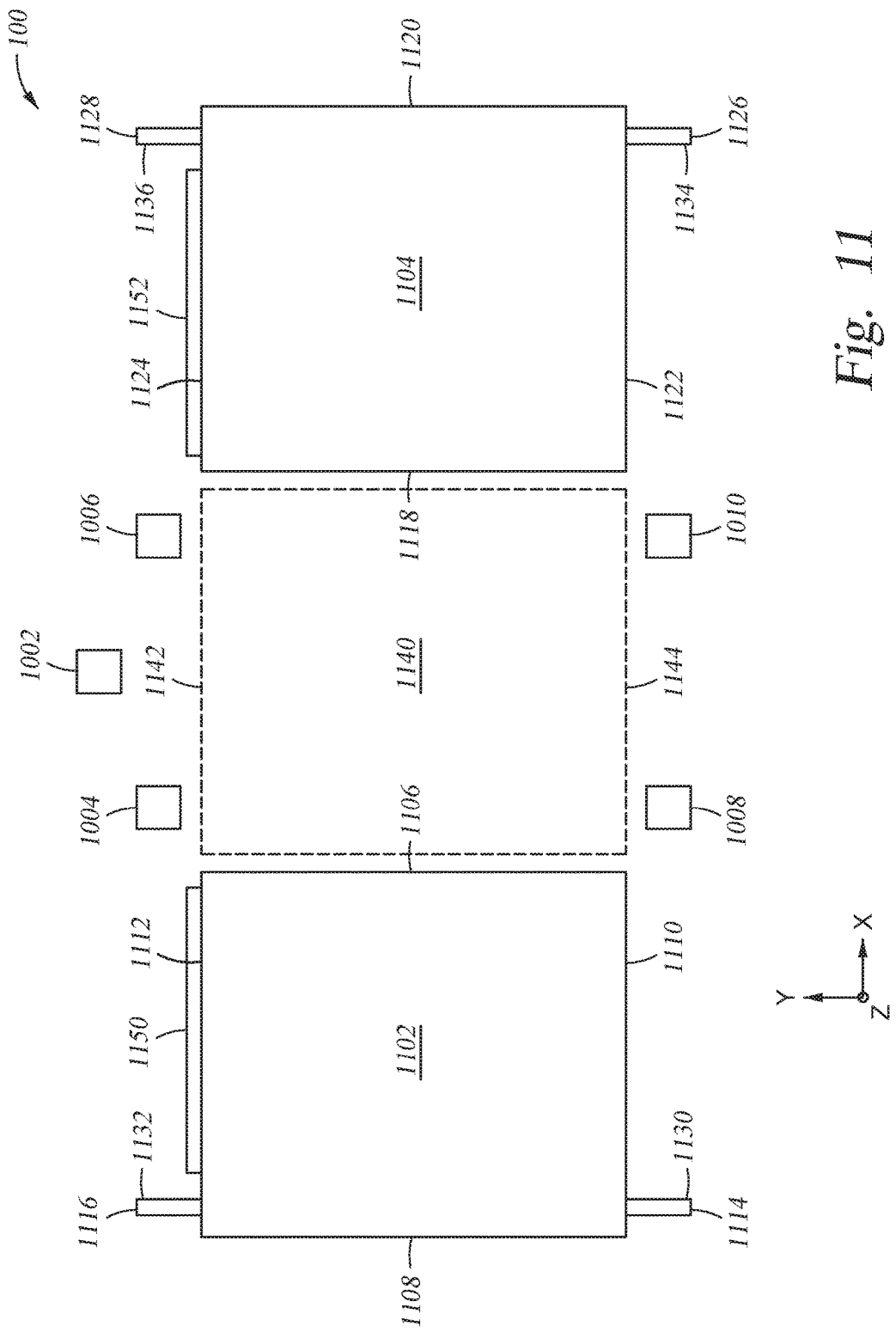
FIG. 11 is a schematic top view of the system according to embodiments disclosed herein.

FIG. 11 is a schematic top view of the system 100 according to embodiments disclosed herein. The system 100 includes the chucks 1102, 1104. The first chuck 1102 includes a first side 1106, a second side 1108 opposite the side 1106, a third side 1110 connecting the first side 1106 and the second side 1108, and a fourth side 1112 opposite the third side 1110. In some embodiments, the first and second sides 1106, 1108 are substantially parallel, and the third and fourth sides 1110, 1112 are substantially parallel. Mirrors 1114, 1116 are disposed on sides 1110, 1112 of the chuck 1102, respectively. The second chuck 1104 includes a first side 1118, a second side 1120 opposite the first side 1118, a third side 1122 connecting the first side 1118 and the second side 1120, and a fourth side 1124 opposite the third side 1122. In some embodiments, the first and second sides 1118, 1120 are substantially parallel, and the third and fourth sides 1122, 1124 are substantially parallel. Mirrors 1126, 1128 are disposed on sides 1122, 1124 of the chuck 1104, respectively. Mirrors 1114, 1116 may be aligned in the Z-direction, mirrors 1126, 1128 may be aligned in the Z-direction, but the mirrors 1114 or 1116 are not aligned with the mirrors 1126 or 1128 in the Z-direction, respectively. Mirrors 1114, 1116, 1126, 1128 each include a surface 1130, 1132, 1134, 1136, respectively, for reflecting a laser beam. The surfaces 1130, 1132, 1134, 1136 may be substantially perpendicular to the sides 1110, 1112, 1122, 1124, respectively.

During operation, either chuck 1102 or 1104 is moved along the X-direction to the processing position, shown as chuck 1140 represented by dotted lines. The chuck 1140, which represents either the chuck 1102 or chuck 1104 in the processing position, includes sides 1142, 1144. As shown in FIG. 11, interferometers 1002, 1004, 1006, 1008, 1010 coupled to the plate 600 are located adjacent the chuck 1140. The plate 600 is omitted to illustrate the locations of the interferometers 1002, 1004, 1006, 1008, 1010. Interferometers 1008, 1010 may be located adjacent the side 1144, and interferometers 1004, 1006 may be located adjacent the side 1142. The interferometer 1010 is utilized to measure the location of the substrate disposed on the chuck 1102 with respect to the X-direction, and the interferometer 1008 is utilized to measure the location of the substrate disposed on the chuck 1102 with respect to the X-direction. Thus, the interferometer 1010 and the mirror 1114 are aligned in the Z-direction, and the interferometer 1008 and the mirror 1126 are aligned in the Z-direction. The interferometer 1010 and the mirror 1114 are not aligned in the Z-direction with the interferometer 1008 and the mirror 1126 in order to prevent the mirror 1114 or 1126 from hitting the interferometer 1008 or 1010 during operation. The interferometer 1006 is utilized to measure the location of the substrate disposed on the chuck 1102 with respect to the X-direction, and the interferometer 1004 is utilized to measure the location of the substrate disposed on the chuck 1104 with respect to the X-direction. Thus, the interferometer 1006 and the mirror 1116 are aligned in the Z-direction, and the interferometer 1004 and the mirror 1128 are aligned in the Z-direction. The interferometer 1006 and the mirror 1116 are not aligned in the Z-direction with the interferometer 1004 and the mirror 1128 in order to prevent the mirror 1116 or 1128 from hitting the interferometer 1004 or 1006 during operation.

The interferometers 1010, 1006 detect any change in distance between the interferometers 1010, 1006 and the mirrors 1114, 1116, respectively, i.e., any change in the X-direction. Any change in the X-direction can be translated into the location of the substrate (not shown) disposed on the chuck 1102 with respect to the X-direction during operation. The interferometers 1008, 1004 detect any change in distance between the interferometers 1008, 1004 and the mirrors 1126, 1128, respectively, i.e., any change in the X-direction. Any change in the X-direction can be translated into the location of the substrate (not shown) disposed on the chuck 1104 with respect to the X-direction during operation. The interferometer 1002 may be disposed between the interferometers 1006, 1004 to detect any change in distance between the interferometer 1002 and mirror 1150 coupled to the side 1112 or mirror 1152 coupled to the side 1124, i.e., any change in the Y-direction. Any change in the Y-direction can be translated into the location of the substrate (not shown) disposed on the chuck 1102 or 1104 with respect to the Y-direction during operation.

In summary, a photolithography system is disclosed. The photolithography system includes a plate that is utilized as a reference point for identifying and compensating any shifting of the lenses. One or more pairs of sensor/target may be located adjacent to an opening formed in the plate and on the lens extending through the opening, and the sensor/target may be used to measure the distances between the lens and the plate. Any deviation from a reference distance of the measured distances indicates the lens has shifted, and measures are performed to compensate for the shifting of the lens. In addition, the plate may be utilized to control the position of the chuck during operation by coupling one or more interferometers to the plate.

While the foregoing is directed to embodiments of the present disclosure, other and further embodiments of the disclosure may be devised without departing from the basic scope thereof, and the scope thereof is determined by the claims that follow.

The invention claimed is:

1. A photolithography system, comprising:
    a slab;
    a chuck disposed on the slab;
    a plurality of image projection systems disposed over the slab, wherein each image projection system of the plurality of image projection systems includes a lens, wherein the lens includes a lens housing;
    a first plurality of sensors each coupled to a corresponding lens housing of each image projection system of the plurality of image projection systems;
    a plate disposed between the slab and the plurality of image projection systems, wherein the plate includes a plurality of openings; and
    one or more targets coupled to the plate and disposed adjacent to each opening of the plurality of openings.

2. The photolithography system of claim 1, wherein the first plurality of sensors comprises capacitance sensors.

3. The photolithography system of claim 2, wherein the one or more targets comprise one or more metal bars.

4. The photolithography system of claim 1, further comprising a second plurality of sensors distinct from the first plurality of sensors, wherein each sensor of the second plurality of sensors is coupled to a corresponding lens housing of each image projection system of the plurality of image projection systems, and wherein the one or more targets comprise a first target and a second target.

5. The photolithography system of claim 1, wherein the plate further comprises one or more interferometers.

6. A photolithography system, comprising:
a slab;
a chuck disposed on the slab;
a plurality of image projection systems disposed over the slab, wherein each image projection system of the plurality of image projection systems includes a lens, wherein the lens includes a lens housing;
one or more sensors coupled to the lens housing of the lens of each image projection system; and
a plate disposed between the slab and the plurality of image projection systems, wherein the plate includes a plurality of openings and one or more targets disposed adjacent to each opening of the plurality of openings, wherein the one or more sensors comprise a first sensor and a second sensor, and the one or more targets comprise a first target and a second target, wherein the first sensor and the first target are aligned in a first direction, and the second sensor and the second target are aligned in a second direction.

7. A photolithography system, comprising:
a slab;
a chuck disposed on the slab;
a plurality of image projection systems disposed over the slab, wherein each image projection system of the plurality of image projection systems includes a lens, wherein the lens includes a lens housing;
one or more sensors coupled to the lens housing of the lens of each image projection system; and
a plate disposed between the slab and the plurality of image projection systems, wherein the plate includes a plurality of openings and one or more targets disposed adjacent to each opening of the plurality of openings, wherein the one or more sensors comprise a first sensor and a second sensor, and the one or more targets comprise a first target and a second target, wherein the one or more sensors further comprise a third sensor and a fourth sensor, and the one or more targets further comprise a third target and a fourth target.

8. The photolithography system of claim 7, wherein the third sensor and the third target are aligned in the first direction, and the fourth sensor and the fourth target are aligned in the second direction.

9. A photolithography system, comprising:
a slab;
a chuck disposed on the slab;
a plurality of image projection systems disposed over the slab, wherein each image projection system of the plurality of image projection systems includes a lens, wherein the lens includes a lens housing;
a first plurality of targets each coupled to a corresponding lens housing of each image projection system of the plurality of image projection systems;
a plate disposed between the slab and the plurality of image projection systems, wherein the plate includes a plurality of openings; and
one or more sensors coupled to the plate and disposed adjacent to each opening of the plurality of openings.

10. The photolithography system of claim 9, wherein the one or more sensors comprise one or more capacitance sensors.

11. The photolithography system of claim 10, wherein the first plurality of targets comprises metal bars.

12. The photolithography system of claim 9, further comprising a second plurality of targets distinct from the first plurality of targets, wherein each target of the second plurality of targets is coupled to a corresponding lens housing of each image projection system of the plurality of image projection systems, and wherein the one or more sensors comprise a first sensor and a second sensor.

13. The photolithography system of claim 9, wherein the plate further comprises one or more interferometers.

14. A photolithography system, comprising:
a slab;
a chuck disposed on the slab;
a plurality of image projection systems disposed over the slab, wherein each image projection system of the plurality of image projection systems includes a lens, wherein the lens includes a lens housing;
one or more targets coupled to the lens housing of the lens of each image projection system; and
a plate disposed between the slab and the plurality of image projection systems, wherein the plate includes a plurality of openings and one or more sensors disposed adjacent to each opening of the plurality of openings, wherein the one or more sensors comprise a first sensor and a second sensor, and the one or more targets comprise a first target and a second target, wherein the first sensor and the first target are aligned in a first direction, and the second sensor and the second target are aligned in a second direction.

15. A photolithography system, comprising:
a slab;
a chuck disposed on the slab;
a plurality of image projection systems disposed over the slab, wherein each image projection system of the plurality of image projection systems includes a lens, wherein the lens includes a lens housing;
one or more targets coupled to the lens housing of the lens of each image projection system; and
a plate disposed between the slab and the plurality of image projection systems, wherein the plate includes a plurality of openings and one or more sensors disposed adjacent to each opening of the plurality of openings, wherein the one or more sensors comprise a first sensor and a second sensor, and the one or more targets comprise a first target and a second target, wherein the one or more sensors further comprise a third sensor and a fourth sensor, and the one or more targets further comprise a third target and a fourth target.

16. The photolithography system of claim 15, wherein the third sensor and the third target are aligned in the first direction, and the fourth sensor and the fourth target are aligned in the second direction.

17. A method, comprising:
moving a substrate under a plurality of image projection systems, wherein each image projection system of the plurality of image projection systems includes a lens;
extending each lens of the plurality of image projection systems towards the substrate disposed on a chuck, wherein each lens is extended through a plate disposed between the substrate and the plurality of image projection systems, wherein the plate includes a plurality of openings, and each lens is extended through a corresponding opening of the plurality of openings, wherein one or more elements are disposed adjacent to each opening; and measuring one or more distances between each lens and the one or more elements.

18. The method of claim 17, wherein the one or more elements comprise one or more sensors, wherein each lens includes a lens housing, and one or more targets are coupled to the lens housing.

19. The method of claim 17, wherein the one or more elements comprise one or more targets, wherein each lens includes a lens housing, and one or more sensors are coupled to the lens housing.

20. The method of claim 17, further comprising comparing the measured one or more distances to a reference distance.

\* \* \* \* \*